(12) United States Patent
Stefanov (10) Patent No.: US 10,629,715 B2
(45) Date of Patent: Apr. 21, 2020

(54) UNIDIRECTIONAL ESD PROTECTION WITH BURIED BREAKDOWN THYRISTOR DEVICE

(71) Applicant: NXP USA, Inc., Austin, TX (US)

(72) Inventor: Evgueniy Nikolov Stefanov, Vieille Toulouse (FR)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/119,550

(22) Filed: Aug. 31, 2018

(65) Prior Publication Data

US 2020/0013885 A1 Jan. 9, 2020

(30) Foreign Application Priority Data

Jul. 4, 2018 (EP) ..................................... 18305876

(51) Int. Cl.
*H01L 29/06* (2006.01)
*H01L 29/08* (2006.01)
(Continued)

(52) U.S. Cl.
CPC ........ *H01L 29/7424* (2013.01); *H01L 21/266* (2013.01); *H01L 21/26513* (2013.01);
(Continued)

(58) Field of Classification Search
CPC ............ H01L 29/7424; H01L 29/0804; H01L 29/083; H01L 29/0834; H01L 29/0839; H01L 29/0843; H01L 29/0865; H01L 29/0692; H01L 29/1004; H01L 29/1008; H01L 29/1012; H01L 29/1016; H01L 29/102; H01L 29/42308; H01L 29/66121; H01L 29/66128; H01L 29/66212; H01L 29/66265; H01L 29/66363; H01L 29/66393; H01L 29/70; H01L 29/7317; H01L 29/7436; H01L 29/861; H01L 29/87; H01L 21/26513; H01L 21/266; H01L 21/76283; H01L 21/8222; H01L 27/0262;
(Continued)

(56) References Cited

U.S. PATENT DOCUMENTS 6,441,437 B1 * 8/2002 Gossner .............. H01L 27/0248
257/355
6,717,219 B1 4/2004 Vashchenko et al.
(Continued)

FOREIGN PATENT DOCUMENTS

EP 0414934 A1 6/1991

*Primary Examiner* — Natalia A Gondarenko (57) ABSTRACT

An electrostatic discharge protection device includes a substrate, first and second emitter regions disposed in the substrate, laterally spaced from one another on a side of the substrate, and having opposite conductivity types, and first and second base regions having opposite conductivity types and in which the first and second emitter regions are disposed in a thyristor arrangement, respectively. The first base region includes a buried doped layer that extends under the second base region. Each of the buried doped layer and the second base region includes a respective non-uniformity in dopant concentration profile. A spacing between the buried doped layer and the second base region at the respective non-uniformities establishes a breakdown trigger voltage for the thyristor arrangement.

20 Claims, 5 Drawing Sheets

(51) Int. Cl.
- *H01L 29/66* (2006.01)
- *H01L 29/74* (2006.01)
- *H01L 27/02* (2006.01)
- *H01L 21/265* (2006.01)
- *H01L 21/266* (2006.01)
- *H01L 21/762* (2006.01)
- *H01L 27/12* (2006.01)

(52) U.S. Cl.
 CPC ...... *H01L 27/0262* (2013.01); *H01L 29/0692* (2013.01); *H01L 29/083* (2013.01); *H01L 29/0834* (2013.01); *H01L 29/66363* (2013.01); H01L 21/76283 (2013.01); H01L 27/1203 (2013.01)

(58) Field of Classification Search
 CPC ............... H01L 27/075; H01L 27/0783; H01L 27/1027; H01L 27/1028; H01L 27/1203; H01L 29/74; H01L 29/7432; H01L 29/0626; H01L 29/66356; H01L 29/66371; H01L 2924/1301; H01L 2924/13011; H01L 2924/13022; H01L 2924/13026; H01L 2924/13027; H01L 2924/1303; H01L 27/0921; G11C 11/39
 USPC ........ 257/119, 173, 355, 358, 360, E29.215, 257/351, 378, 379
 See application file for complete search history.

(56) References Cited

U.S. PATENT DOCUMENTS

| | | | |
|---|---|---|---|
| 6,919,588 B1 | 7/2005 | Vashchenko et al. | |
| 7,023,028 B2* | 4/2006 | Jensen | H01L 27/0259 257/111 |
| 7,566,595 B2 | 7/2009 | Steinhoff | |
| 8,637,900 B2 | 1/2014 | Gauthier, Jr. et al. | |
| 2005/0151160 A1 | 7/2005 | Salcedo et al. | |
| 2009/0179222 A1* | 7/2009 | Ker | H01L 27/0262 257/119 |
| 2009/0236631 A1 | 9/2009 | Chen et al. | |
| 2011/0176243 A1 | 7/2011 | Zhan et al. | |
| 2011/0284922 A1* | 11/2011 | Salcedo | H01L 27/0262 257/119 |
| 2012/0218671 A1 | 8/2012 | Domanski et al. | |
| 2012/0231587 A1* | 9/2012 | Gendron | H01L 27/0259 438/133 |
| 2014/0054642 A1 | 2/2014 | Edwards et al. | |
| 2014/0065773 A1 | 3/2014 | Gauthier, Jr. et al. | |
| 2014/0299912 A1 | 10/2014 | Lin et al. | |
| 2015/0102384 A1 | 4/2015 | Zhan et al. | |
| 2017/0077296 A1 | 3/2017 | Yang et al. | |

* cited by examiner

UNIDIRECTIONAL ESD PROTECTION WITH BURIED BREAKDOWN THYRISTOR DEVICE

REFERENCE TO RELATED APPLICATIONS

This application claims the benefit of European Patent Application No. EP18305876.7, filed Jul. 4, 2018, the entire disclosure of which is hereby incorporated by reference.

FIELD OF INVENTION

The present embodiments relate to semiconductor devices.

BACKGROUND

Integrated circuits (ICs) are at risk of damage due to electrostatic discharge (ESD) events. ESD events may be caused by an electrostatically charged person holding an IC chip. An ESD event may involve electrostatic potentials of 4000 Volts or more between input/output (I/O) terminals of the IC chip. During the ESD event, a discharge current typically flows between the I/O terminal and ground through vulnerable circuitry in the IC chip.

ESD protection devices are commonly incorporated into IC chips across terminals of the IC chip. ESD protection devices are often configured to protect such circuitry by providing another path to ground for the discharge current. For example, an ESD protection device may be connected between an I/O terminal and a ground or common terminal. The ESD protection device acts as a voltage and current limiter to prevent the voltage between the I/O terminal and the ground terminal from reaching levels that would otherwise harm other devices on the chip.

ESD protection devices are configured to remain quiescent while the voltage between the terminals falls within a normal operating range for the IC chip. When the voltage reaches a triggering voltage above that range, the ESD protection device turns on to shunt any damaging current to ground, thereby preventing damage to the IC chip. The triggering voltage of the ESD protection device exceeds the maximum normal operating voltage of the IC chip to avoid interfering with the normal operation of the IC chip.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of electrostatic discharge (ESD) protection devices, such as ESD protection clamps, and electronic apparatus including such clamps or devices, are described. The devices and apparatus provide ESD protection via avalanche blocking of a buried junction. The buried junction is formed between two base or inner regions of a thyristor arrangement. The buried nature of the junction is established by a buried doped layer of one of the base regions extending under the other base region. The level of the breakdown trigger voltage is established by a spacing between the buried doped layer and the other base region. In some cases, the breakdown voltage level is about 45 Volts, but a range of levels may be attained as described herein. Breakdown of the buried junction establishes a current path during ESD events that passes through a bulk of the substrate rather than at or near the substrate surface. The buried nature of the current path leads to more robust ESD protection, as described herein.

The spacing is established at respective non-uniformities in the dopant concentration profiles of the buried doped layer and other base region. The non-uniformities may include or present a segment or other portion with a different dopant concentration level at the junction and/or a different boundary depth. For instance, the buried doped layer may have a segment with a deeper upper boundary. The deeper upper boundary may be formed via a gap in a dopant implantation procedure mask and/or an additional implantation procedure.

One or both of the base regions may include multiple constituent regions. The presence of multiple constituent regions may be used to establish the spacing for the buried breakdown. For instance, a p-type base region may include two constituent regions, one extending deeper than the other, to define the non-uniformity in dopant concentration profile for that base region.

The buried nature of the breakdown current flow path avoids high current density levels in the device, such as near the substrate surface. The current density levels stay low enough such that localized temperatures resulting from Joule self-heating do not approach the melting temperature of the semiconductor substrate. Current flow through the substrate away from the surface also allows the substrate to dissipate the heat. A buried breakdown current path also avoids hot spots near silicon/silicon dioxide interfaces. Hot carrier injection into oxide regions is avoided. For these reasons, device failures or other damage during stress tests, such as the charged device model (CDM) stress test are prevented. In one example, the disclosed device was capable of passing a CDM test involving a peak current of 10 Amps (A) at 1 kiloVolt (kV). Other examples are capable of sustaining higher stress levels, such as 16 A at 2 kV. Buried breakdown avoids high current density levels near the oxides at the surface. Leakage and other device failures are avoided. More robust ESD protection is therefore provided.

The devices and apparatus of the disclosed embodiments are configured as single polarity or unidirectional ESD protection devices. For instance, the disclosed device may be disposed for blocking in a forward mode between an input/output pin and a ground (or negative) pin. In reverse mode, the devices are forward biased and conductive. Embodiments of the disclosed devices and apparatus may accordingly include another clamp disposed between the pins in the opposite orientation to handle the other, reverse polarity. The other clamp may be configured as described herein with a similar or different breakdown voltage, or may have a different configuration (e.g., a protection diode). In some cases, the clamps may be disposed in series between the two pins. Alternative arrangements may be used.

The improvements in ESD protection are achieved without adversely impacting device size (e.g., footprint). In fact, the improvements in ESD protection may be achieved with a reduction in device footprint. For example, the reduction may be over 50%. As a result, a reduced footprint may be achieved even in cases in which ESD protection is provided for both polarities.

The devices and apparatus of the disclosed embodiments are described herein as a mono- or single-stack ESD protection device. In other cases, multiple devices may be stacked to achieve higher breakdown voltage levels. Stacking the devices may thus be useful in connection with protecting circuitry having a wide range of operating voltage levels. For instance, the disclosed devices may be stacked to protect integrated circuits having high operating voltages such that triggering occurs in a range from about 80 to about 100 Volts.

The disclosed ESD protection devices are stackable, insofar as the thyristor arrangement is isolated from the substrate. For instance, the buried insulator layer of the SOI substrate may be combined with isolation trenches, e.g., deep isolation trench (DTI) regions, to isolate the thyristor arrangement laterally from the rest of the protected integrated circuit. The devices may also be isolated from the bulk or base substrate by a buried oxide layer.

The trigger voltages of the disclosed embodiments are adjustable. The spacing between the base regions at the non-uniformities may be selected to achieve desired trigger voltage levels, as described below.

The disclosed embodiments may be used to protect a variety of semiconductor devices having a wide range of operating voltages. Although described below in connection with fabrication processes directed to power transistor devices, such as LDMOS devices, the disclosed embodiments may be configured to protect other semiconductor devices, such as bipolar transistor or other MOS devices. For example, in some embodiments, including some of those in which the protected devices include LDMOS transistor devices, the pins of the IC chip may be rated for operation at voltages as low as about 5 Volts to as high as about 105 Volts. The disclosed embodiments may be configured to accommodate such wide ranges of operating voltages via stacking or other serial arrangements of the disclosed ESD protection devices, as described below. The disclosed ESD protection devices may thus be used to accommodate different operating voltages on the same IC chip. Different operating voltages may alternatively or additionally be accommodated by varying the configuration, e.g., lateral width, depth, dopant concentration level, and/or other aspects of the base regions, as described below.

Although described below in connection with a p-type substrate layer, the disclosed devices are not limited to any particular transistor dopant configuration. The disclosed devices are not limited to p-type epitaxial layers or p-type bulk substrates. Semiconductor regions of opposite conductivity type may be substituted for the regions described herein in cases in which an n-type epitaxial layer is used. Thus, for example, each semiconductor region, layer or other structure in the examples described below may have a conductivity type, e.g., n-type or p-type, opposite to the type identified in the examples below.

Figure 1:
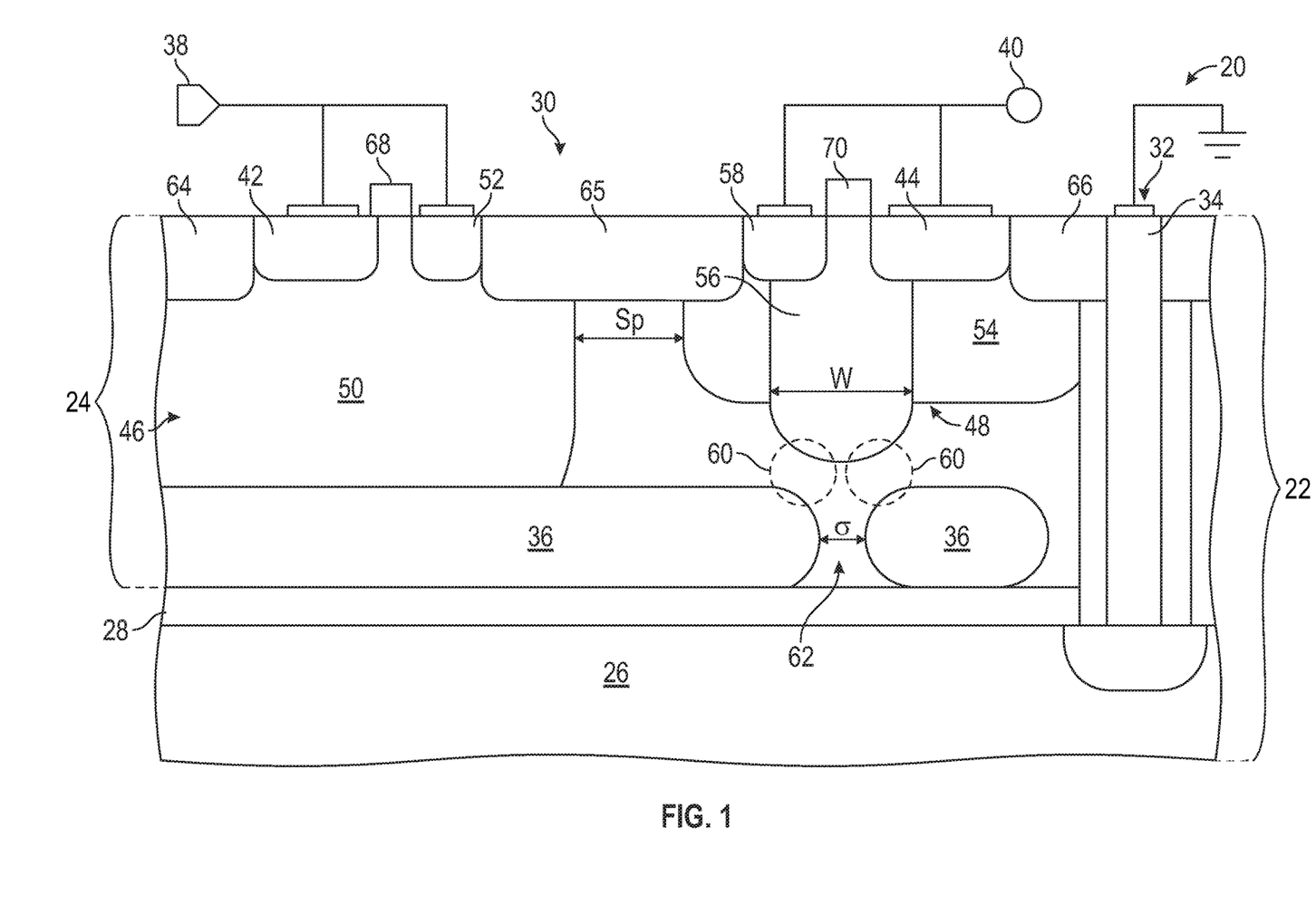
FIG. 1 is a cross-sectional, schematic, partial view of an exemplary electrostatic discharge (ESD) protection device having a thyristor arrangement with buried breakdown in accordance with one embodiment.

FIG. 1 is a schematic cross-sectional view of an example of an ESD protection device 20 constructed in accordance with one embodiment. The device 20 includes a semiconductor substrate 22, which may, in turn, include a number of epitaxial layers 24. In this example, the semiconductor substrate 22 includes a p-type epitaxial layer 24 grown above a base substrate 26. Additional epitaxial layers may be grown. The base substrate 26 may be a heavily doped n-type semiconductor substrate, but a p-type substrate may also be used. The doping concentration level of the base substrate 26 may also vary, and need not be heavily doped. The device 20 may alternatively or additionally include other semiconductor layers, e.g., non-epitaxial layers, in which one or more device regions are formed. Any one or more of the layers of the semiconductor substrate 22 may include silicon. Alternative or additional semiconductor materials may be used in other embodiments.

The substrate 22 may include a buried insulator layer 28 between the base substrate 26 and the epitaxial layer(s) 24. The buried insulator layer 28 may include silicon oxide, e.g., $SiO_2$. The buried insulator layer 28 may have a thickness of about 0.3 µm, but other thicknesses, materials, and layers may be used. In some cases, the base substrate 26 and the buried insulator layer 28 may correspond with the silicon and insulator layers of a silicon-on-insulator (SOI) substrate. The substrate 22 may have other semiconductor-on-insulator constructions. The epitaxial layer 24 may be grown via conventional SOI techniques involving, for instance, a seed layer disposed on the buried insulator layer 28.

The structural, material, and other characteristics of the semiconductor substrate 22 may vary from the example shown. For example, additional, fewer, or alternative layers may be included in the semiconductor substrate 22. Any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 30 of the device 20 is depicted in the cross-section of FIG. 1. The device area 30 may be considered, or correspond with, an active area of the device 20. In this embodiment, a lateral perimeter or periphery of the device area 30 is defined by one or more isolation trenches. In this example, one or more ring-shaped deep trench isolation (DTI) regions 32 surround the device area 30. The DTI region(s) 32 may include an insulating material, such as $SiO_2$. The construction, materials, and other characteristics of the DTI region(s) 32 may vary. For example, the DTI region(s) 32 may be formed by etching the semiconductor material of the epitaxial layer(s) 24. The DTI region(s) 32 may isolate the device area 30 from the surrounding substrate 22 by laterally surrounding the device area 30 and extending downward to reach the depth of the buried insulator layer 28 or other device isolating layer.

The device area 30 shown in FIG. 1 may correspond with only a portion of the device 20. For instance, the device area 30 shown may correspond with half or about half of the device 20. In such cases, the portion of the device area 30 shown may be replicated about a lateral symmetry line, such as the left side of the cross-sectional view of FIG. 1.

The isolation trench(es) may include a substrate connection to bias the substrate 22. In this example, the isolation trench includes a substrate tie 34 disposed between the DTI regions 32. The substrate tie 34 may be configured as an inner conductive trench, such as a doped polysilicon plug, that extends from a surface of the substrate 22 through the epitaxial layer(s) 24 and the buried insulating layer 28 to establish the electrical connection to the base substrate 26. The device area 30 may alternatively or additionally be defined by one or more outer doped isolation regions in the semiconductor substrate 22, e.g., the epitaxial layer 24, disposed along the lateral periphery of the device area 30.

The device 20 includes a buried doped layer 36. The buried doped layer 36 may be configured to provide additional device isolation for other transistor devices formed in the substrate 22. For instance, the buried doped layer 36 may form a lower portion of an isolation tub disposed around such other transistor devices. In this example, the buried doped layer 36 is an n-type buried layer disposed above the buried insulator layer 28. The buried doped layer 36 may be formed or disposed in the original SOI substrate before the growth of the epitaxial layer(s) 24. In this embodiment, the buried doped layer 36 extends laterally across, e.g., under, the device area 30. The thickness, dopant concentration level, and other characteristics of the buried doped layer 36 may be selected to provide isolation for the active areas of other devices formed in the substrate 22.

Notwithstanding the isolation function for those other devices, the buried doped layer 36 is configured to provide a non-isolation function for the ESD device 20. The buried doped layer 36 is configured to act as part of a base or inner region of a silicon controlled rectifier (SCR) or other thyristor arrangement of the device 20. In this case, the buried doped layer 36 is part of the current path of the thyristor arrangement. As described below, the buried doped layer 36 establishes a junction of the thyristor arrangement. The positioning, dopant concentration, and other aspects of the buried doped layer 36 are therefore determinative of the breakdown trigger voltage of the device 20. With the buried doped layer 36 spaced from the substrate surface, the junction is a buried junction. The current path is accordingly spaced from the surface of the substrate 22.

The ESD protection device 20 may be part of an electronic apparatus having a number of terminals across which an ESD event may occur. The terminals may be or include any type of input/output (I/O) terminal, such as pins or pads. In this example, the electronic apparatus includes an anode terminal 38 and a cathode terminal 40. The cathode terminal 40 may correspond with a common or ground terminal of the electronic apparatus. However, the references to "anode" and "cathode" are provided only for convenience in description of the bidirectional nature of the ESD protection device 20. As a single polarity or unidirectional device, the ESD protection device 20 is configured to shunt ESD discharge current between the terminals 38, 40, and away from the protected devices of the electronic apparatus, when the anode terminal 38 is positive relative to the cathode terminal 40.

In addition to the pads, pins, or other external connection components of the ESD protection device 20, the anode and cathode terminals 38, 40 include one or more metal layers, interconnects, or other conductive connections, supported by the semiconductor substrate 22 and passivated by one or more dielectric layers, which are not shown. Such metal layers, interconnects, or connections are depicted schematically in FIG. 1.

The ESD protection device 20 is configured as an SCR device or other type of thyristor disposed between the anode and cathode terminals 38, 40. The device 20 has a thyristor arrangement in the sense that four regions of alternating conductivity type (e.g., a sandwich of p-n-p-n regions) are disposed between the anode 38 and cathode terminals 40. The four regions are arranged to form a pair of interconnected bipolar transistors, one PNP transistor and one NPN transistor. References to the thyristor arrangement herein are directed to this arrangement of the four regions, rather than to the manner in which the regions may be terminated. As described below, the region conventionally associated with the gate terminal of a thyristor device is electrically tied to the terminal considered to be the cathode of the thyristor device. The ESD protection device 20 may thus be considered to present or include a two-terminal thyristor device, rather than a three-terminal thyristor device.

In the embodiment of FIG. 1, the thyristor is arranged for non-destructive breakdown in response to forward polarity ESD events in which the anode terminal 38 is positive biased with reference to the cathode terminal 40. The thyristor is configured such that the breakdown trigger voltage level is suitably above an operating voltage of the other devices formed in the substrate 22. The thyristor arrangement is conductive during negative polarity ESD events. One or more further ESD protection devices may be disposed in the substrate 22 to address such negative polarity ESD events.

The thyristor arrangement includes emitter regions 42, 44 disposed in the substrate 22. The emitter regions 42, 44 are laterally spaced from one another on the same side of the substrate 22. The thyristor thus has a lateral arrangement. The emitter region 42 is electrically tied to the anode 38. The emitter region 44 is electrically tied to the cathode 40. The emitter regions 42, 44 have opposite conductivity types. In the example shown, the emitter region 42 is or includes a heavily doped, p-type contact region. The emitter region 44 is or includes a heavily doped, n-type contact region.

The thyristor arrangement includes base regions 46, 48 disposed in the substrate 22. The base regions 46, 48 are the inner regions of the thyristor arrangement. The base regions 46, 48 may thus be referred to as inner thyristor regions. The emitter regions 42, 44 are disposed in the base regions 46, 48, respectively, to form the thyristor arrangement. As described below, the emitter regions 42, 44 may be electrically tied to the base regions 46, 48, respectively. In the example of FIG. 1, the regions are electrically tied via one or more patterned metal layers.

Each base region 46, 48 may be a composite region including any number of constituent regions. In this example, the base region 46 includes a well region 50 in which the emitter region 42 is disposed. The well region 50 is an n-type well region.

The base region 46 also includes a contact region 52 disposed in the substrate 22 within the well region 50. In this case, the base contact region 52 is a heavily doped, n-type region. Like the emitter region 42, the base contact region 52 is electrically tied to the anode terminal 38. The emitter region 42 and the base contact region 52 (and, by extension, the remainder of the base region 46) are thus electrically tied to one another. Collectively, the emitter region 42 and the base contact region 52 form one terminal of a two-terminal thyristor arrangement.

The base region 46 still further includes the doped buried layer 36. In this case, the well region 50 extends through the epitaxial layer 24 to reach the doped buried layer 36. The well region 50 may be configured as, or include, a sinker region that extends from the substrate surface to the buried doped layer 36. In this case, the well region 50 is in contact with the doped buried layer 36. A voltage of the ESD event applied to the contact region 52 is thus provided to the buried doped layer 36 via the well region 50.

The base region 48 of the thyristor arrangement includes multiple constituent well regions. In this example, the base region 48 includes a well region 54 and a well region 56 laterally surrounded by the well region 54. The well regions 54, 56 are n-type wells disposed in the epitaxial layer 24 in this case. The base region 48 further includes a contact region 58 at the substrate surface for biasing the base region 48. Like the emitter region 44, the base contact region 58 is electrically tied to the cathode 40. The base contact region 58 (and, by extension, the remainder of the base region 48) and the emitter region 44 are thus electrically tied to one another to provide the other terminal of the two-terminal thyristor arrangement.

The two base regions 46, 48 define a junction of the thyristor arrangement. Breakdown occurs across a buried section or portion of the junction during an ESD event. The thyristor of the device 20 is arranged such that the doped buried layer 36 of the base region 46 extends under the constituent well regions 54, 56 of the base region 48. The section or portion of the junction between the doped buried layer 36 and the constituent well regions 54, 56 is thus buried within the substrate 22. This section of the junction extends laterally across the device area 30 at a buried depth. This section of the junction is thus laterally oriented in this portion of the device area 30.

The breakdown trigger voltage for the thyristor arrangement is established by a spacing or gap between the two base regions 46, 48. In the example shown, the spacing is between the buried doped layer 36 and the base region 48. In this case, a portion of the epitaxial layer 24 of the substrate 22 is disposed in the spacing.

Each of the buried doped layer 36 and the base region 48 includes a respective non-uniformity in dopant concentration profile. The spacing between the buried doped layer 36 and the base region 48 is established at the respective non-uniformities. In this example, the non-uniformities create two areas 60 of minimum spacing between the buried doped layer 36 and the base region 48. The buried doped layer 36 (and other parts of the base region 46) and the base region 48 are configured such that breakdown in an ESD event occurs in one or both of the areas 60. The nature and characteristics of the non-uniformities of the buried doped layer 36 and the base region 48 are described in greater detail below.

The terms "non-uniform" and "non-uniformity" are used herein to refer to effective differences in dopant concentration profile (i.e., dopant concentration level versus depth) within a well or other region disposed in a semiconductor substrate. Absent the non-uniformity, the dopant concentration profile within the region would otherwise be expected to be uniform. In contrast, changes in dopant concentration profile at or near a lateral edge of a region, where the dopant concentration profile naturally transitions to that of an adjacent region, are not considered to be within the region. Such changes are accordingly not considered to be non-uniformities in the dopant concentration profile, as the term is used herein. An effective difference is a difference that has a discernable and not insignificant effect on device operation or performance. As a result, the term "non-uniform" (and any derivatives thereof) is used herein to mean "effectively non-uniform."

The buried doped layer 36 includes a segment 62 that defines the non-uniformity in the buried doped layer 36. In some cases, the segment 62 has a decreased or lower dopant concentration level relative to a remainder of the buried doped layer 36. The lower dopant concentration level of the segment 62 may thus define the non-uniformity in the buried doped layer 36. In FIG. 1, the segment 62 is depicted as a gap in the buried doped layer 36 for ease in illustration. A lateral width σ of the segment 62 is a characteristic of the non-uniformity that may be adjusted to establish a desired spacing between the buried doped layer 36 and the base region 48 and, thus, a desired breakdown trigger voltage level. The lateral width σ may thus be a factor in determining the breakdown trigger voltage. In some cases, the lateral width σ of the segment 62 falls in a range from about 1.5 to about 2.5 microns, but other lateral widths may be used.

The segment 62 may correspond with, or be otherwise formed via, a gap or hole in a mask used during an implantation procedure directed to forming the buried doped layer 36. The lateral width σ may or may not correspond with the size of the gap in the mask. During subsequent processing steps, dopant implanted during the procedure diffuses, spreading into the gap. As a result, the dopant concentration level in the segment 62 is lower than elsewhere in the buried doped layer 26.

The non-uniformity in the buried doped layer 36 may alternatively or additionally be defined by the positioning of the segment 62. For example, an upper boundary of the buried doped layer 36 may be deeper in the segment 62 relative to a remainder of the buried doped layer 36. The deeper upper boundary of the segment 62 may arise from the above-referenced mask gap, another implantation procedure, and/or another process variation.

In the example of FIG. 1, the deeper upper boundary and/or the lower dopant concentration level of the segment 62 lead to breakdown occurring in the areas 60 rather than, for instance, between the segment 62 and the base region 48. The lower dopant concentration level and/or deeper upper boundary of the segment 62 and/or other characteristics of the non-uniformity of the buried doped layer 36 may be formed by other procedures, including, for instance, a separate implantation procedure and/or other doping process.

The non-uniformity of the dopant concentration profile of the base region 48 is defined by the manner in which the constituent well region 56 differs from the constituent well region 54. In this case, the dopant concentration profile differs in both depth and peak dopant concentration level. The constituent well region 56 extends deeper into the substrate 22 than the constituent region 54. The constituent well region 56 has a higher peak dopant concentration level than the constituent well region 54. In some cases, the constituent well region 56 may have a higher dopant concentration level than the constituent well region 54 at a given depth.

The depth of the lower boundary of the constituent well region 56 may be selected to achieve a desired spacing between the buried doped layer 36 and the base region 48. The breakdown voltage level varies accordingly. For instance, the breakdown voltage level decreases as the depth of the lower boundary of the constituent well region 56 increases. In one example, the constituent well region 56 extends about 2 to about 3 microns deeper into the substrate 22 than the constituent well region 54. The depth of the lower boundary of the constituent well region 56 may be varied for other reasons, including, for instance, the dopant concentration level of the constituent well region 56 and/or other adjacent or nearby regions.

The breakdown voltage level is also determined by the dopant concentration level of the constituent well region 56. The breakdown voltage level decreases as the dopant concentration level of the constituent well region 56 increases.

In one example, the peak dopant concentration level of the constituent well region 56 is about double that of the constituent well region 54.

The operation of the device 20 may also be optimized by selection of a lateral width W of the constituent well region 56. For instance, the lateral width W may be determinative of the spacing between the buried doped layer 36 and the base region 48. The spacing across which breakdown occurs increases as the lateral width W decreases, thereby increasing the breakdown voltage level. The lateral width W may thus be another factor in achieving a desired breakdown voltage level. In some cases, the lateral width W falls in a range from about 0.7 to about 2 microns, but other widths may be used.

The various parameters provided by the above-described non-uniformities may be adjusted to achieve a desired breakdown trigger voltage level. But not all of the parameters may be adjustable for a given device or fabrication technology. For instance, the depth and dopant concentration level parameters may be set for other purposes, insofar as pre-existing implantation procedures may be used to form the respective wells or other regions. The desired breakdown level may nonetheless be achieved by adjusting the above-described lateral widths given those depths and concentration levels. In the example of FIG. 1, a desired breakdown voltage level may be set by selecting the lateral width W and the lateral width σ. In one example, a breakdown voltage level that falls in a range from about 43 Volts to about 46 Volts is achieved. In that case, the breakdown voltage would be about 38 Volts if the base region 48 only included a single well with the profile of the constituent well region 54 (i.e., no constituent well region 56) and the buried doped layer 36 did not include the segment 62. The breakdown voltage level may vary from that example considerably. For instance, breakdown at 50 Volts or more may be achieved with increased spacing between the base regions 46, 48 (e.g., by increasing the lateral width of the segment 62 and/or by decreasing the lateral width of the constituent well region 56).

The above-referenced parameters and regions may be optimized or otherwise selected to achieve other device operation characteristics. For instance, a desired holding voltage (e.g., voltage after snapback) of the device 20 may be achieved by adjusting the lateral width W and/or the lateral position of the constituent well region 56. In the example of FIG. 1, the constituent well region 56 laterally overlaps both the p+ contact region 58 and the emitter region 44. The extent of the overlap and/or the position of the positioning of the lateral boundaries of the constituent well region 56 may be optimized or otherwise selected to achieve a desired holding voltage. For example, the holding voltage increases as the lateral boundary near the base contact region 58 shifts toward the base region 46 (i.e., to the left in the view of FIG. 1). The change in holding voltage may result from a modification in the current path arising from shifting the lateral boundary and/or the amount of lateral overlap. The boundary positioning and/or amount of overlap may also be selected to adjust the parasitic resistance between the emitter region 44 and the base region 48 of the cathode terminal 40. The amount of the lateral overlap may vary. For instance, the constituent well region 56 may or may not laterally overlap more than half of the base contact region 58 as shown. Similarly, the constituent well region 56 may or may not laterally overlap less than half of the emitter region 44 as shown.

The relative positioning of the constituent well region 56 may also be selected to tune or otherwise achieve desired operational characteristics. For instance, the holding voltage may be modulated via lateral shifting of the constituent well region 56. In the example shown, moving the constituent well region 56 toward the emitter region 44 may result in faster trigger and a lower holding voltage. In such cases, the lateral width W of the constituent well region 56 may or may not remain constant.

Other regions of the device 20 may define other sections of the junction between the base regions 46, 48. In this example, another section of the junction is disposed between the well region 50 and the well region 54. The interface between the well regions 50, 54 extends vertically. This section of the junction is thus vertically oriented. The lateral distance between the well regions 50, 54 is denoted in FIG. 1 as a distance Sp. The distance Sp is sufficiently large such that breakdown during an ESD event does not occur in this section. In some cases, the distance Sp is greater than the spacing between the base regions 46, 48 at the non-uniformities. But the lower dopant concentration level of the constituent well region 54 may allow the distance Sp to be higher in other cases. Either way, the distance Sp is sufficiently large to ensure that buried breakdown occurs, e.g., in the above-described laterally oriented section of the junction of the thyristor arrangement.

As described below, the above-described regions of the thyristor arrangement may be formed via one or more existing implantation procedures used to form other devices in the substrate 22. For instance, the existing procedures may be configured as respective power FET implants. Further details regarding power FET implant examples are provided below in connection with FIG. 5. In some cases, the wells, layers, or other regions are formed by a single implant (e.g., a deep or sinker implant to form the well region 50). In other cases, a region is formed via a combination of multiple implants.

The relative lateral sizes of the emitter regions 42, 44 and the base contact regions 52, 58 may differ as shown. For instance, the emitter regions 42, 44 may be larger than the base contact regions 52, 58 to support a desired current capacity. Other lateral sizes and relative sizes may be used.

The emitter regions 42, 44 and the base contact regions 52, 58 are highly doped to establish or support an Ohmic contact or other low resistance connection to a respective one of the terminals 38, 40. The relative positions of the emitter region 42 and the base contact region 52 may be swapped. The relative positions of the emitter region 44 and the base contact region 58 may be swapped.

A number of shallow trench isolation (STI) regions 64-66 may be formed at the surface of the semiconductor substrate 22. In this embodiment, the STI region 65 is disposed laterally adjacent to, and between, the base regions 46, 48. The STI region 65 is protected from hot carrier injection and/or other damage by the buried breakdown established via the above-described non-uniformities in the base regions 46, 48. Additional, fewer, or alternative STI regions may be provided. For example, the STI region 66 along the DTI region 32 may be enlarged or omitted in some cases depending on the demand for isolation.

A number of silicide blocks 68, 70 may be formed on the substrate surface to isolate contacts for each of the above-referenced contact regions. In this example, the silicide blocks 68, 70, 72 are supported by the semiconductor substrate 22 and positioned adjacent contacts for anode and cathode terminals 38, 40. The silicide block 68 is positioned between respective contacts for the emitter region 42 and the base contact region 52. The silicide block 70 is positioned between respective contacts for the emitter region 44 and the base contact region 58. In some cases, the silicide blocks 68, 70 define or establish the spacing between the contact regions. One or both of the silicide blocks 68, 70 may be composed of, or include, a sandwich of one or more silicon dioxide and one or more silicon nitride layers. Additional, fewer, or alternative silicide blocks may be provided. For example, an additional silicide block may be positioned over the STI region 65.

The substrate isolation provided by the buried insulating layer 28 allows the ESD protection device 20 to be stackable. For example, multiple ESD protection devices may be arranged in series to form a multi-device ESD clamp having a breakdown trigger voltage level that approximately equals or otherwise corresponds with the sum of the individual trigger voltage levels. The series arrangement may involve connecting the anode electrodes of a top or upper ESD protection device to a pin or other I/O terminal, connecting the cathode electrodes of the top ESD protection device to the anode electrodes of a bottom or lower ESD protection device, and connecting the cathode electrodes of the bottom ESD protection to ground or another I/O terminal or another ESD protection device. In one example with two ESD protection devices each having trigger voltage levels of 40 Volts, the stacked or series arrangement provides a trigger voltage level of 80 Volts. Pins with different operating voltage levels on the same IC chip may thus be provided with proper ESD protection. The voltage level of the snapback point for the ESD clamp may also approximately equal the sum of the individual snapback voltage levels. Further details regarding the stacking of ESD clamps or other protection devices are provided in U.S. Patent Publication No. 2011/0176243.

Figure 2:
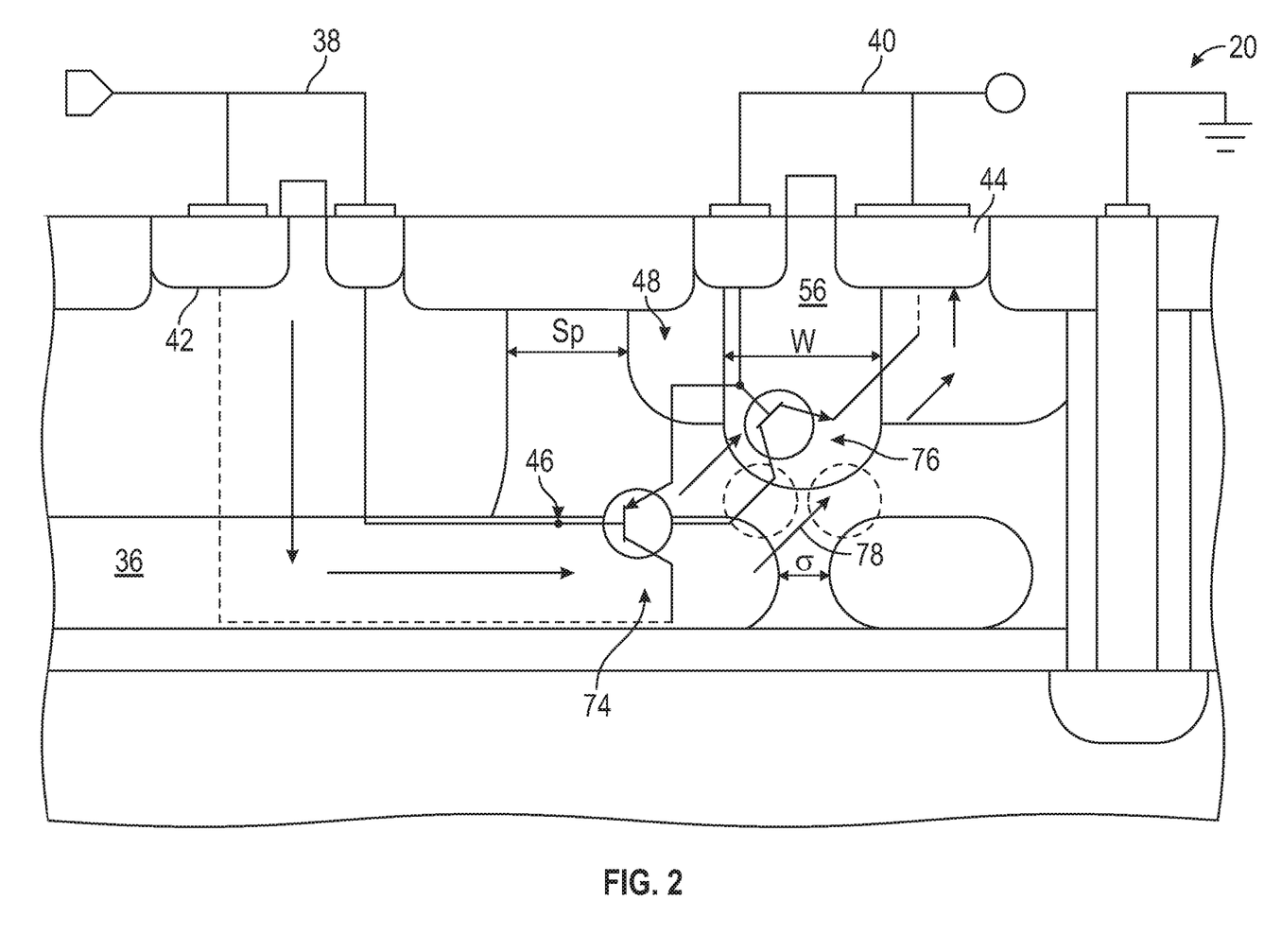
FIG. 2 is a cross-sectional, schematic, partial view of the exemplary ESD protection device of FIG. 1 with markings to depict a current flow path during operation.

FIG. 2 is another cross-sectional view of the device 20 to depict operational characteristics of the device 20. The thyristor arrangement of the device 20 may be considered to include two bipolar transistors 74, 76. In this example, the transistor 74 is a pnp transistor. The pnp transistor 74 includes the emitter region 42 and the base region 46 as an emitter and a base, respectively. The various p-type regions of the base region 48 effectively act as the collector of the pnp transistor 74. In this example, the transistor 76 is an npn transistor. The npn transistor 76 includes the emitter region 44 and the base region 48 as an emitter and a base, respectively. The various n-type regions of the base region 46 effectively act as the collector of the npn transistor 76.

During operation in forward polarity, when a positive ESD stress is applied to the anode terminal 38 with reference to the cathode terminal 40, the junction between the base regions 46, 48 is reverse biased, the breakdown trigger voltage of the ESD protection device 20 is determined by the base-to-base spacing at the non-uniformities, as described above. The buried doped layer 36 of the base region 46 eventually reaches a voltage level—the breakdown trigger voltage level—that causes sufficient depletion for avalanche breakdown across the junction between the buried doped layer 36 and the constituent well region 56. Current is then provided to the respective bases of the transistors 74, 76. Each transistor 74, 76 is accordingly turned on, allowing substantial amounts of current to flow between the anode and cathode terminals 38, 40. Current is shunted along a buried path 78 as shown. The buried path 78 passes through the buried doped layer 36 and the constituent well region 56.

In reverse polarity operation, a negative stress is applied to the anode terminal 38 with reference to the cathode terminal 40. The cathode terminal 40 is thus effectively positively biased. In that case, the transistors 74, 76 of the device 20 are transformed into a forward biased diode. The diode includes the p-type regions tied to the cathode 40 and the n-type regions tied to the anode 38.

Figure 3:
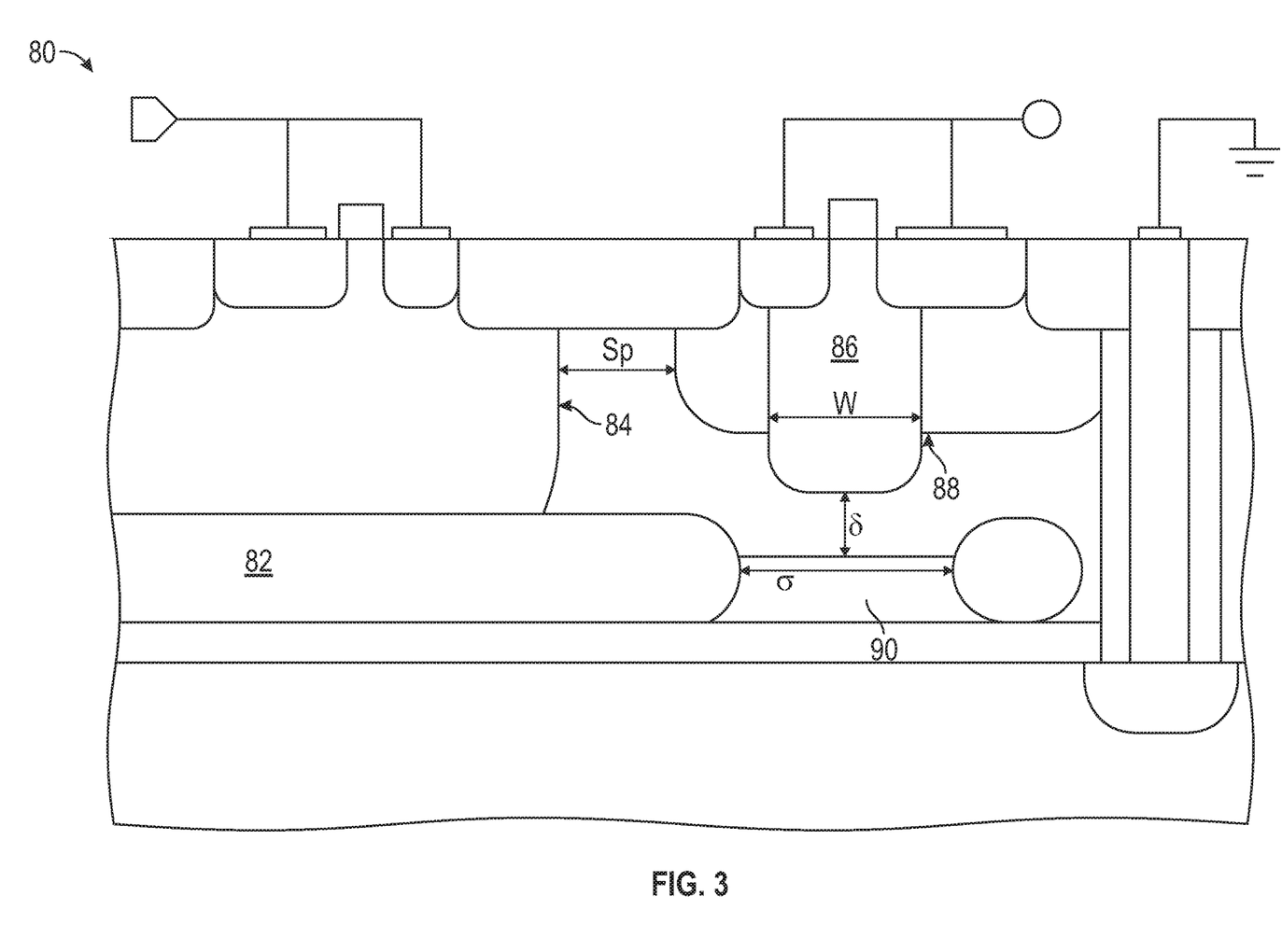
FIG. 3 is a cross-sectional, schematic, partial view of another exemplary ESD protection device having a thyristor arrangement with buried breakdown in accordance with one embodiment.

FIG. 3 depicts an ESD protection device 80 in accordance with an embodiment having an alternative non-uniformity. The ESD protection device 80 is configured as another single polarity, two-terminal ESD protection device similar in several respects to the above-described devices. For example, the ESD protection device 80 has a thyristor arrangement that may be configured for buried breakdown as described above. The buried breakdown occurs between a buried doped layer 82 of a base region 84 and a constituent well region 86 of a base region 88.

The junction between the buried doped layer 82 and the constituent well region 86 may thus be similarly positioned and oriented. For instance, the junction may be configured by the non-uniformities of the buried doped layer 82 and the constituent well region 86. The buried doped layer 82 includes a segment 90 having a deeper upper boundary and a lower dopant concentration level relative to the remainder of the buried doped layer 82. The constituent well region 86 may have a deeper lower boundary and a higher dopant concentration level relative to the other constituent well region of the base region 88.

The ESD protection device 80 differs from the above-described embodiments in connection with the configuration of the buried doped layer 82. The segment 90 still has a decreased dopant concentration level and a deeper upper boundary relative to a remainder of the buried doped layer 82 to define the non-uniformity in the buried doped layer 82. But in this example, the dopant concentration profile of the segment 90 of the buried doped layer 82 may be customized or otherwise formed by a dedicated dopant implantation procedure. For example, the segment 90 may be formed with an implant having a higher energy than the implant used to form the remainder of the buried doped layer 82. As a result, the higher energy implant forms a dopant concentration profile with a deeper upper boundary than the remainder of the buried doped layer 82. Thus, one need not rely solely on diffusion to form the profile of the segment 90. The profiles of the segment 90 and the remainder of the buried doped layer 82 may differ in additional and/or alternative ways. For instance, the profile in the segment 90 may have a dopant concentration level that increases with depth, the level remaining lower than the dopant concentration of the remainder of the buried doped layer 82 throughout the thickness of the segment 90.

In this example, the segment 90 is wider than the lateral width W of the constituent well region 86. Other widths and relative widths may be used.

The distance δ between a lower boundary of the constituent well region 86 and an upper boundary of the segment 90 may be optimized or otherwise selected to adjust the breakdown voltage level to a desired level. In some cases, the distance δ falls in a range from about 0.5 microns to about 1 micron, but other distances may be used.

One or more of the regions of the thyristor arrangement may differ from the examples described above. For example, the buried doped layer 36 (FIG. 1) and the buried doped layer 82 (FIG. 3) may not be formed from an implant with a gap. In such cases, the buried doped layers 36, 82 may not include the outer portion near the DTI region. A segment of lower dopant concentration level and lower upper boundary may nonetheless be formed via diffusion and/or a separate implantation procedure, as described herein.

Other non-uniformity configurations or arrangements may be used to achieve buried breakdown at a desired breakdown voltage level. For instance, one or more aspects of the above-described non-uniformities may be swapped between the base regions of the device. The non-uniformities may be considered to be one of two types. A first type is a higher doped projection that establishes a deeper lower boundary. A second type is a lower doped recession that establishes a deeper upper boundary. In the above-described examples, the p-type base region has the first type, and the n-type base region has the second type. In other embodiments, the base regions may be configured to present or include the other types of non-uniformities. In such cases, the p-type base region has a constituent region, section, or other portion with a shallower lower boundary and a lower dopant concentration level. The shallower lower boundary effectively recedes from the n-type base region. The n-type base region has a region, section or other portion with a shallower upper boundary and a higher dopant concentration level. The shallower upper boundary effectively projects upward toward the p-type base region. In this way, the spacing between the two base regions may again be optimized or selected to achieve buried breakdown at a desired breakdown voltage level.

The above-described devices are shown in simplified form. For example, FIGS. 1-3 do not show the metal layers configured for electric coupling with the various regions and structures of the devices. The devices may have a number of other structures or components for connectivity, isolation, passivation, and other purposes not shown in FIGS. 1-3 for ease in illustration. For instance, the devices may include any number of additional isolating regions or layers, e.g., in addition to those described above and in addition to the silicide blocks shown.

The dopant concentrations, thicknesses, and other characteristics of the above-described semiconductor regions in the above-described semiconductor substrates may vary. In one example of the embodiment shown in FIG. 1, the above-referenced semiconductor regions may have the following approximate concentrations and thicknesses:

|  | Concentration | Thickness |
|---|---|---|
| epitaxial 24: | $1 \times 10^{15}$-$2 \times 10^{15}$/cm$^3$ | 4-6 μm |
| substrate 26: | $1 \times 10^{15}$-$1 \times 10^{16}$/cm$^3$ | not applicable |
| buried doped layer 36: | $1 \times 10^{18}$-$8 \times 10^{19}$/cm$^3$ | 1-3 μm |
| emitters 42, 44: | $1 \times 10^{19}$-$5 \times 10^{21}$/cm$^3$ | 0.15-0.3 μm |
| well 50: | $1 \times 10^{17}$-$5 \times 10^{19}$/cm$^3$ | varies to reach layer 36 |
| contact 52, 58: | $1 \times 10^{19}$-$5 \times 10^{21}$/cm$^3$ | 0.15-0.3 μm |
| well 54: | $1 \times 10^{17}$-$6 \times 10^{17}$/cm$^3$ | 1.4-2.5 μm |
| well 56: | $2 \times 10^{17}$-$1 \times 10^{18}$/cm$^3$ | 1.8-3 μm |
| layer 90: | $6 \times 10^{15}$-$1 \times 10^{17}$/cm$^3$ | 1-2 μm |

The concentrations and thicknesses may be different in other embodiments. For example, the dopant concentration of the original substrate 26 may vary considerably.

Figure 4:
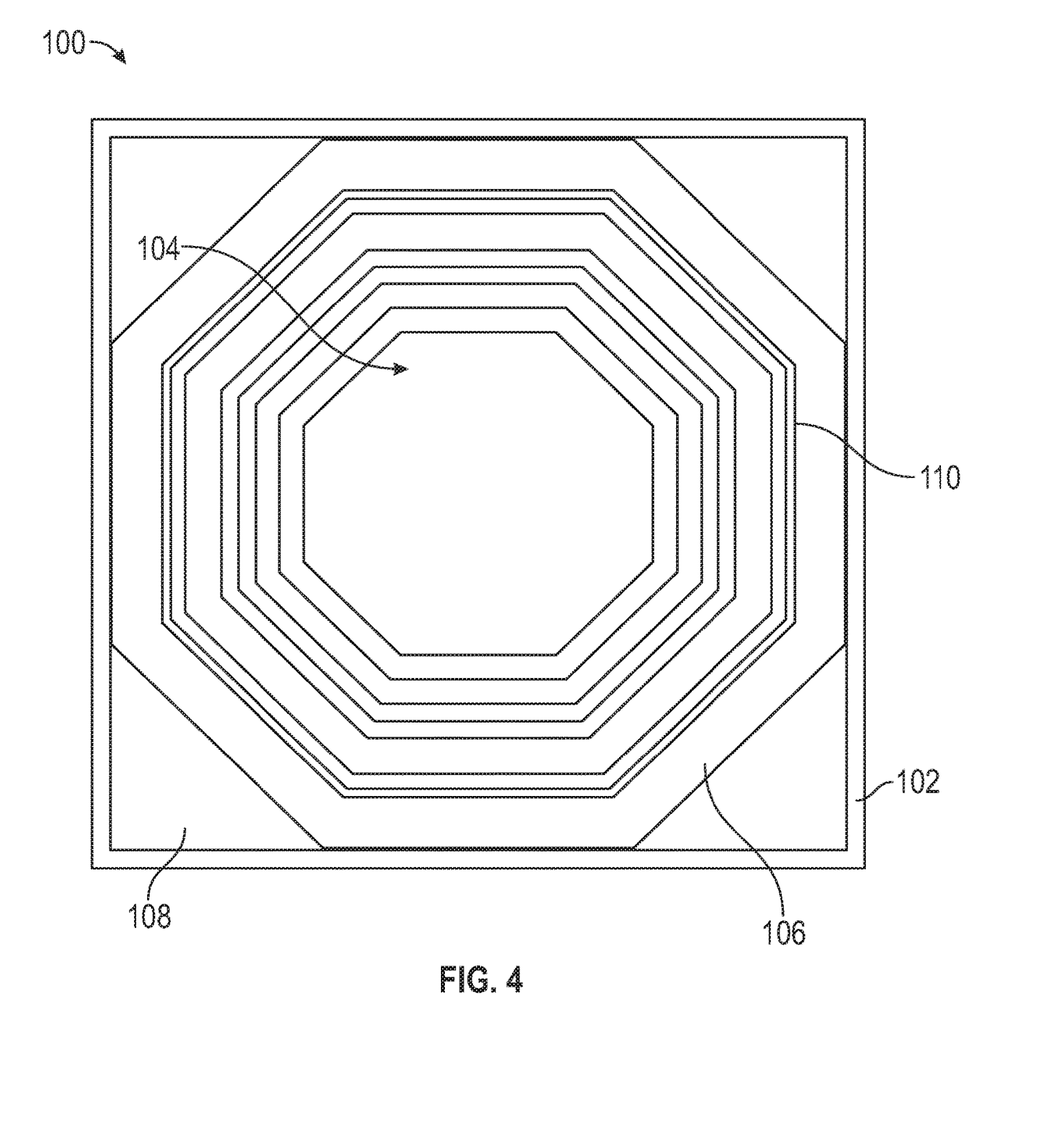
FIG. 4 is a layout view of an exemplary ESD protection device having a thyristor arrangement with buried breakdown in accordance with one embodiment.

FIG. 4 is a layout view of a device 100 having a thyristor arrangement configured for buried breakdown as described herein and in accordance with one example. In this case, the device 100 is configured as described above in connection with the example of FIGS. 1 and 2 or the example of FIG. 3. In other cases, the configuration of the device 100 differs from the examples described above in one or more ways. For instance, the non-uniformities may be inverted as described above.

The device 100 has a device area defined by a DTI ring 102. In this example, the DTI ring 102 has a square layout. The rectilinear nature of the DTI ring 102 may arise from design rules for the fabrication process used to form the DTI ring 102. The design rule may only allow 90 degree directional changes. Other shapes or patterns may be used in other cases. For instance, the DTI ring 102 may have a pattern that matches the layout of the device area.

In the example of FIG. 4, the device area of the device 100 has an octagonal layout. In this case, the octagonal layout has an input/output contact or anode 104 in the center of the octagonal layout and a ground or negative contact or cathode 106 along an outer periphery of the octagonal layout. The input/output contact or anode 104 may thus has an octagonal shape. The ground contact or cathode 106 may thus be shaped as an octagonal shaped ring.

The various regions and elements of the device 100 described herein constitute respective octagonal rings or areas that surround the input/output contact 104. For instance, the ground contact 106 is shaped as an octagonal ring. Disposed about the ground contact 106 is a constituent well region 108 of the device 100 that extends inward from the DTI ring 102. The constituent well region 108 may correspond with the constituent well region 54 of FIG. 1. Within the constituent well region 108, octagonal ring-shaped contact regions are formed, such as a base contact region 110 and an emitter region outward of the base contact region 110. The base contact region 110, emitter regions, and base regions of the device 100 are shaped such that the thyristor arrangement has an octagonal layout. In the octagonal layout, the other emitter region and a well region of the other base region are disposed inward of the base contact region 110 and the outer emitter region.

Other layouts may be used. For example, the devices may have a square or other rectilinear layout. In some cases, e.g., when design rules allow, circular or other rounded layouts may be used.

In the example of FIG. 4, the device 100 occupies an area of 62 microns by 62 microns. That area may correspond with a more than 50% reduction in device footprint relative to other ESD protection devices configured for a given breakdown voltage and/or current capacity. The device layout, area, and footprint may differ considerably from the example shown.

Figure 5:
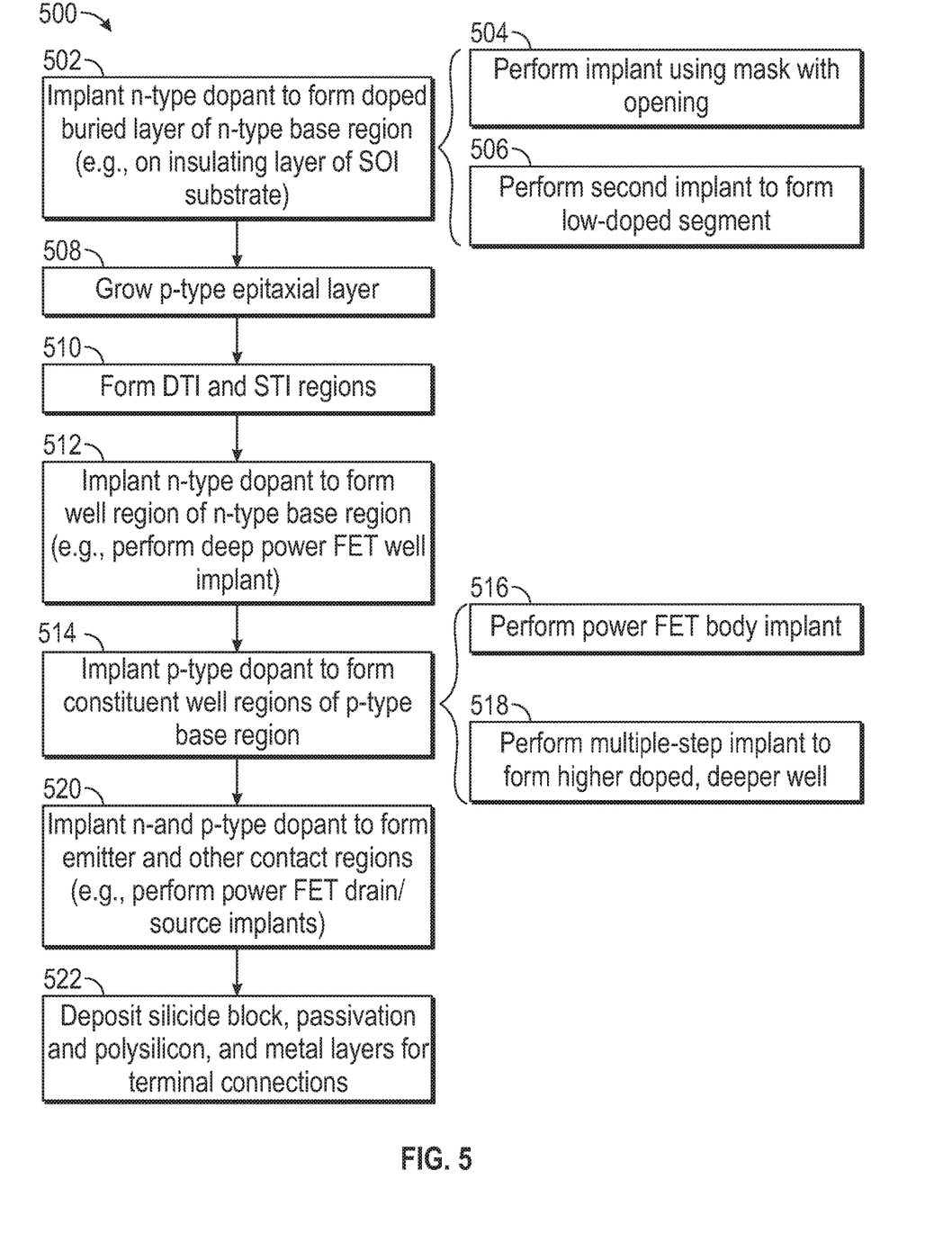
FIG. 5 is a flow diagram of an exemplary fabrication sequence to construct an ESD protection device having a thyristor arrangement with buried breakdown in accordance with one embodiment.

FIG. 5 shows an exemplary fabrication method 500 for fabricating an ESD protection device in an electronic apparatus. The method 500 may be directed to fabricating an ESD protection device having a thyristor arrangement with buried breakdown as described above. The ESD protection device is fabricated with a semiconductor substrate, the regions or layers of which may have the conductivity types of the examples described above, or be alternatively configured with opposite conductivity types. The method includes a sequence of steps or acts, only the salient of which are depicted for convenience in illustration. The ordering of the steps may vary in other embodiments. For example, one or more implants directed to forming a well of one base region may be implemented after an implant directed to forming a well of the other base region. The fabrication method is not limited to any particular doping mechanism, and may include future developed doping techniques.

Each of the dopant implantation procedures used in the method 500 may be preexisting dopant implantation procedures. The procedures may thus be configured to form regions of other devices formed in the same substrate, i.e., the transistor devices protected by the ESD protected by the ESD protection device. The ESD protection device may thus be formed without adding steps to the fabrication process. Cost increases are accordingly avoided.

The method 500 may begin with, or include, a step 502 in which an n-type layer is formed via, e.g., an n-type implant procedure, in a semiconductor layer of a semiconductor substrate. The semiconductor layer may be a p-type layer of an SOI substrate having a base substrate and a buried insulating layer between the base substrate and the semiconductor layer.

The n-type layer may be formed to have a non-uniformity in dopant concentration profile as described above. In some cases, the step 502 includes a step 504 in which an implantation procedure is performed using a mask configured such that dopant is not deposited in a gap having a desired width. Subsequent diffusion of dopant into the gap then establishes a lower doped segment of the n-type layer that constitutes the non-uniformity. In some cases, the step 502 also includes a step 506 in which another implantation procedure is performed to form the lower doped segment. In such cases, the width of the lower doped segment may be greater than the lateral width W of a later formed constituent well region of a base region. The gap of the implant of the step 504 may be wider than the width of the implant that forms the lower doped segment.

A p-type epitaxial layer may then be grown on the original semiconductor substrate in a step 508 to define a surface of the semiconductor layer of the substrate. Any number of epitaxial layers may be grown. With the growth of the epitaxial layer, the n-type layer is configured as a buried doped layer.

Any number of STI and DTI regions may then be formed in the substrate in a step 510. The STI and DTI regions may be formed via any now known or hereafter developed procedure. For example, the step 510 may include the formation of a trench and the deposition via, e.g., chemical vapor deposition (CVD), of one or more materials in the trench. In some embodiments, the trench is filled with silicon oxide. Additional or alternative materials may be deposited to fill the trench or to damage the substrate. In an alternative embodiment, the STI and/or DTI regions are formed after one or more regions or components of the ESD protection device are formed. The step 510 may also include the formation of an inner trench substrate tie as described above in which a conductive material, e.g., doped polysilicon, is deposited to form a plug or other tie that extends from a surface of the semiconductor layer through the buried insulating layer to electrically connect to the base substrate.

In a step 512, a well region of a base region of the ESD protection device is formed in the semiconductor substrate via one or more dopant implant procedures. The procedure(s) may be configured to form one or more sinker regions, e.g., device isolating regions, of a power FET device. As a result, the well region of the well of the base region may extend through the epitaxial layer to reach the buried doped layer. In some embodiments, the implants are configured to implant n-type dopant. In the exemplary method of FIG. 5, a deep power FET n-type well implant is used to form the well region.

In a step 514, constituent well regions of a base region of the ESD protection device are formed in the semiconductor substrate via multiple dopant implant procedures. The constituent well regions may correspond with the p-type constituent well regions described above. The multiple procedures may be configured and used to form one or more regions of a power FET device. For instance, in a step 516, one of the dopant implantation procedures may be directed to forming a body region of the power FET device, such as a body of an LDMOS device. The procedure of the step 516 may be configured to form the constituent well region 54 of FIG. 1. A mask for the dopant implant procedure laterally spaces the resulting constituent base region from the well region of the other base region (e.g., the well region 50) as described above such that buried breakdown instead occurs.

The multiple dopant implantation procedures of the step 514 are configured to define the non-uniformity. For instance, in a step 518, another one of the procedures may be configured to form the constituent well region 56 of FIG. 1. The procedure of the step 518 may also be configured and used to form a region of another device, such as a power FET device. In some cases, the step 518 may include multiple implants—e.g., a multiple step implant based on the same mask. The multiple implants may have differing energies and/or doses. The step 518 may result in a deeper lower boundary and higher peak dopant concentration level relative to the other constituent well region formed by the step 516 and as described above. For instance, the multiple implants may be configured such that the resulting constituent well region (e.g., the constituent well region 56) has a higher dopant concentration level throughout the thickness thereof relative to the other constituent well region.

The above-described emitter and contact regions are formed in a step 520. Existing dopant implantation procedures may be used in the step 520. For instance, the contact and emitter regions may be formed by n-type and p-type source/drain implants for a power FET device.

After the base contact and emitter regions are formed, a number of procedures are implemented in a step 522 to develop structures supported by the surface of the semiconductor substrate. For instance, a number of silicide blocks may be formed. The substrate surface may also be passivated via deposition of one or more dielectric layers. The passivation or dielectric layers may be patterned to allow one or more conductive (e.g., metal) layers to be deposited to establish the above-described electrical terminal connections, such as the interconnects linking the base and emitter regions.

The above-described procedures and steps may be performed in other orders. For instance, the silicide blocks may be deposited before the formation of the emitter and contact regions to act as hard masks. Additional or alternative steps or acts may be implemented at various points during the fabrication procedure.

The disclosed ESD protection devices are configured to establish a buried conduction path between anode and cathode terminals, or between the p+ and n+ emitters of an SCR or other thyristor arrangement. The buried conduction path avoids having avalanche occur at or near the substrate surface. Avalanche is instead located in the bulk of the substrate across a buried junction. Having the avalanche breakdown in the bulk spaces any self-heating away from the substrate surface. Buried breakdown also reduces the probability of damage at oxide interfaces near the surface. More robust ESD protection is therefore achieved.

The above-described devices may also have a layout or topology that avoids edge or other effects that could otherwise affect the robustness of the device. For instance, the device may have an octagonal or other quasi-circular layout as described above. Quasi-circular symmetry helps to avoid edge or other parasitic effects.

The buried junction may be formed along an interface between a deeper and more highly doped well region and a lower doped segment of a buried doped layer. The lower doped segment may be formed by an implant with a mask gap and/or by a separate implant. The gap spacing of the buried doped layer implant and the lateral width of the well region modulate the breakdown voltage of the device. The lateral spacing of the base regions of the thyristor arrangement is large enough (e.g., greater than about 3.5 microns)

to avoid breakdown away from the buried junction, i.e., close to the substrate surface.

In a first aspect, an ESD protection device includes a semiconductor substrate comprising a buried insulator layer and a semiconductor layer over the buried insulator layer having a first conductivity type, and first and second bipolar transistor devices disposed in the semiconductor layer, laterally spaced from one another, and sharing a common collector region having a second conductivity type. The first and second bipolar transistor devices are configured in an asymmetrical arrangement in which the second bipolar transistor device includes a buried doped layer having the second conductivity type and extending along the buried insulator layer from the common collector region across a device area of the second bipolar transistor device.

In a second aspect, an electronic apparatus includes a semiconductor substrate comprising a buried insulator layer and a semiconductor layer over the buried insulator layer having a first conductivity type, a pair of terminals supported by the semiconductor substrate, and a dual polarity electrostatic discharge (ESD) protection device disposed in the semiconductor layer and including first and second bipolar transistor devices and inner and outer sinker regions having a second conductivity type and extending through the semiconductor layer to reach the buried insulator layer. The inner sinker region is configured as a common collector region of the first and second bipolar transistor devices. The outer sinker region is disposed between the second bipolar transistor device and a lateral periphery of the dual polarity ESD protection device. The first and second bipolar transistor devices are configured in an asymmetrical arrangement in which conduction of the first bipolar transistor device is triggered by breakdown at a first junction along the inner sinker region and in which conduction of the second bipolar transistor device is triggered by breakdown at a second junction along the outer sinker region.

In a third aspect, a method of fabricating an ESD protection device includes forming a buried doped layer in a semiconductor layer of a semiconductor substrate including a base substrate and a buried insulating layer between the base substrate and the semiconductor layer, the semiconductor layer and the buried doped layer having first and second conductivity types, respectively. The method further includes performing a first well implantation procedure to implant dopant of the second conductivity type in the semiconductor layer to form inner and outer sinker regions. The inner sinker region is configured to establish a common collector region of first and second bipolar transistor devices of the ESD protection device. The method further includes performing a second well implantation procedure to implant dopant of the first conductivity type in the semiconductor layer to form respective base regions of the first and second bipolar transistor devices. The first well implantation procedure is configured such that the inner and outer sinker regions extend through the semiconductor layer to reach the buried doped layer. The first and second well implantation procedures are configured such that conduction of the first bipolar transistor device is triggered by breakdown between the inner sinker region and the base region of the first bipolar transistor device and such that conduction of the second bipolar transistor device is triggered by breakdown between the outer sinker region and the base region of the second bipolar transistor region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides, e.g., nitrides, oxy-nitride mixtures, etc. Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electrostatic discharge protection device comprising:
a substrate;
first and second emitter regions disposed in the substrate, laterally spaced from one another on a side of the substrate, and having opposite conductivity types; and
first and second base regions having opposite conductivity types and in which the first and second emitter regions are disposed in a thyristor arrangement, respectively, the first base region comprising a buried doped layer that extends under the second base region;
wherein the buried doped layer comprises a first non-uniformity in dopant concentration profile and the second base region comprises a second non-uniformity in dopant concentration profile,
wherein a spacing between the first non-uniformity of the buried doped layer and second non-uniformity of the second base region establishes a breakdown trigger voltage for the thyristor arrangement, and
wherein the buried doped layer comprises a segment having a decreased dopant concentration level and a deeper upper boundary relative to a remainder of the buried doped layer to define the first non-uniformity in the buried doped layer.

2. The electrostatic discharge protection device of claim 1, wherein the buried doped layer comprises a segment having a decreased dopant concentration level relative to a remainder of the buried doped layer to define the first non-uniformity in the buried doped layer.

3. The electrostatic discharge protection device of claim 1, wherein the buried doped layer comprises a segment having a deeper upper boundary relative to a remainder of the buried doped layer to define the first non-uniformity in the buried doped layer.

4. The electrostatic discharge protection device of claim 1, wherein the second base region comprises first and second constituent well regions, the second constituent well region differing from the first constituent well region to define the second non-uniformity of the dopant concentration profile for the second base region.

5. The electrostatic discharge protection device of claim 4, wherein the second constituent well region extends deeper into the substrate than the first constituent region.

6. The electrostatic discharge protection device of claim 4, wherein the second constituent well region has a higher peak dopant concentration level than the first constituent well region.

7. The electrostatic discharge protection device of claim 4, wherein the second constituent well region laterally overlaps the second emitter region and a contact region of the second base region.

8. The electrostatic discharge protection device of claim 1, wherein the breakdown trigger voltage is determined by a first lateral width of the first non-uniformity of the buried doped layer and a second lateral width of the second non-uniformity of the second base region, and
wherein the first lateral width ranges from about 1.5 to about 2.5 microns, while the second lateral width ranges from about 0.7 to about 2 microns.

9. The electrostatic discharge protection device of claim 1, wherein the first and second emitter regions and the first and second base regions are shaped such that the thyristor arrangement has an octagonal layout.

10. The electrostatic discharge protection device of claim 9, wherein, in the octagonal layout, the first emitter region and a well region of the first base region are disposed inward of the second emitter region and the second base region.

11. The electrostatic discharge protection device of claim 1, wherein the first and second emitter regions are electrically tied to the first and second base regions, respectively, such that the thyristor arrangement is a two-terminal thyristor arrangement.

12. An electronic apparatus comprising:
a substrate;
an anode supported by the substrate;
a cathode supported by the substrate and laterally spaced from the anode on a side of the substrate; and
an electrostatic discharge protection device disposed in the substrate and connected between the anode and the cathode, the electrostatic discharge protection device comprising first and second base regions disposed in a thyristor arrangement;
wherein the first base region comprise a buried doped layer that extends under the second base region,
wherein the buried doped layer comprises a first non-uniformity in dopant concentration profile and the second base region comprises a second non-uniformity in dopant concentration profile,
wherein a spacing between the first non-uniformity in dopant concentration profile of the buried doped layer and the second non-uniformity in dopant concentration profile of the second base region establishes a breakdown trigger voltage for the thyristor arrangement, and
wherein the second base region comprises first and second constituent well regions, a lower portion of the second constituent well region extending deeper into the substrate than the first constituent well region and having a higher peak dopant concentration than the first constituent well region.

13. The electronic apparatus of claim 12, wherein:
the buried doped layer comprises a segment having a decreased dopant concentration level relative to a remainder of the buried doped layer to define the first non-uniformity in dopant concentration profile in the buried doped layer.

14. The electronic apparatus of claim 13, wherein the segment of the buried doped layer has a deeper upper boundary relative to the remainder of the buried doped layer.

15. The electronic apparatus of claim 12, wherein:
the thyristor arrangement has an octagonal layout;
the anode is disposed in a center of the octagonal layout; and
the cathode is disposed about an outer periphery of the octagonal layout.

16. The electrostatic discharge protection device of claim 1, wherein the dopant concentration level of the segment increases with depth, while remaining lower than a peak dopant concentration level of the remainder of the buried doped layer.

17. An electrostatic discharge protection device comprising:
a substrate;
first and second emitter regions disposed in the substrate, laterally spaced from one another on a side of the substrate, and having opposite conductivity types; and
first and second base regions having opposite conductivity types and in which the first and second emitter regions are disposed in a thyristor arrangement, respectively, the first base region comprising a buried doped layer that extends under the second base region;
wherein the buried doped layer comprises a first non-uniformity in dopant concentration profile and the second base region comprises a second non-uniformity in dopant concentration profile,
wherein a spacing between the first non-uniformity in dopant concentration profile of the buried doped layer and the second non-uniformity in dopant concentration profile of the second base region establishes a breakdown trigger voltage for the thyristor arrangement, and
wherein the second base region comprises first and second constituent well regions, a lower portion of the second constituent well region extending deeper into the substrate than the first constituent well region and having a higher peak dopant concentration than the first constituent well region.

18. The electrostatic discharge protection device of claim 17, wherein the first base constituent region laterally surrounds the second base constituent region.

19. The electrostatic discharge protection device of claim 17, wherein the second base constituent region is formed in a laterally overlapping relationship with the second emitter region and with a contact region of the second base region, the second base constituent region overlapping a greater portion of the second emitter region than the contact region of the second base region.

20. The electrostatic discharge protection device of claim 17, wherein the substrate comprises a base substrate, a semiconductor layer overlying the base substrate, and a buried insulation layer between the base substrate and the semiconductor layer, and
wherein the buried doped layer contacts and extends along the buried insulation layer.

\* \* \* \* \*